(12) United States Patent
Cho et al.

(10) Patent No.: US 10,714,477 B2
(45) Date of Patent: Jul. 14, 2020

(54) SIGE P-CHANNEL TRI-GATE TRANSISTOR BASED ON BULK SILICON AND FABRICATION METHOD THEREOF

(71) Applicant: Gachon University of Industry-Academic cooperation Foundation, Seongnam-si, Gyeonggi-do (KR)

(72) Inventors: Seongjae Cho, Seoul (KR); Eunseon Yu, Seoul (KR)

(73) Assignee: Gachon University of Industry-Academic Cooperation Foundation (KR)

( * ) Notice: Subject to any disclaimer, the term of this patent is extended or adjusted under 35 U.S.C. 154(b) by 0 days.

(21) Appl. No.: 16/411,381

(22) Filed: May 14, 2019

(65) Prior Publication Data

US 2019/0267378 A1 Aug. 29, 2019

Related U.S. Application Data

(62) Division of application No. 15/372,695, filed on Dec. 8, 2016, now abandoned.

(30) Foreign Application Priority Data

Aug. 11, 2016 (KR) .......................... 10-2016-0102082

(51) Int. Cl.
*H01L 27/092* (2006.01)
*H01L 21/8238* (2006.01)
(Continued)

(52) U.S. Cl.
CPC .... *H01L 27/0924* (2013.01); *H01L 21/02532* (2013.01); *H01L 21/02656* (2013.01);
(Continued)

(58) Field of Classification Search
CPC ........... H01L 27/0924; H01L 29/66795; H01L 29/785; H01L 29/7855; H01L 29/7842;
(Continued)

(56) References Cited

U.S. PATENT DOCUMENTS 7,154,118 B2 12/2006 Lindert et al.
7,326,634 B2 2/2008 Lindert et al.
(Continued)

OTHER PUBLICATIONS

Swahn, B. and Hassoun, S. Electro-thermal analysis of multi-fin devices. IEEE Trans. Very Large Integr. (VLSI) Syst., 16, 7 (2008) 816-829.

*Primary Examiner* — Lex H Malsawma
*Assistant Examiner* — Gardner W. S. Swan
(74) *Attorney, Agent, or Firm* — Gerald E. Hespos; Michael J. Porco; Matthew T. Hespos

(57) ABSTRACT

A p-channel tri-gate transistor has a silicon fin that protrudes from a bulk silicon substrate, a thin silicon-germanium active layer is formed on three sidewalls of the silicon fin, and a hole well is formed between the gate insulating film and the silicon fin in the active layer surrounded by the tri-gate by a valence band offset electric potential against the silicon fin for moving holes collected in the hole well along the active layer with a high hole-mobility. Thus, it is possible to have the effects of not only an ultra-high speed, low power operation, but also a body biasing through an integral structure of the silicon fin-body. The p-channel tri-gate transistor can be fabricated together with an n-channel FinFET transistor in one substrate by the same CMOS process.

7 Claims, 9 Drawing Sheets

(51) Int. Cl.
*H01L 29/78* (2006.01)
*H01L 29/66* (2006.01)
*H01L 21/02* (2006.01)

(52) U.S. Cl.
CPC .......... *H01L 21/823807* (2013.01); *H01L 21/823821* (2013.01); *H01L 21/823878* (2013.01); *H01L 29/66795* (2013.01); *H01L 29/785* (2013.01); *H01L 21/823814* (2013.01)

(58) Field of Classification Search
CPC ......... H01L 29/7831; H01L 21/823807; H01L 21/823878; H01L 21/823821; H01L 21/02656; H01L 21/02532; H01L 21/823814; H01L 21/8238
See application file for complete search history.

(56) References Cited

U.S. PATENT DOCUMENTS

| | | |
|---|---|---|
| 7,781,771 B2 | 8/2010 | Lindert et al. |
| 2005/0035369 A1 | 2/2005 | Lin et al. |
| 2005/0218438 A1 | 10/2005 | Lindert et al. |
| 2005/0224800 A1 | 10/2005 | Lindert et al. |
| 2007/0111419 A1 | 5/2007 | Doyle |
| 2007/0257322 A1 | 11/2007 | Shi et al. |
| 2008/0142841 A1 | 6/2008 | Lindert et al. |
| 2013/0056795 A1 | 3/2013 | Wu et al. |
| 2015/0076558 A1 | 3/2015 | Lee et al. |
| 2016/0181366 A1 | 6/2016 | Oh et al. |
| 2016/0276347 A1 | 9/2016 | Cea et al. |

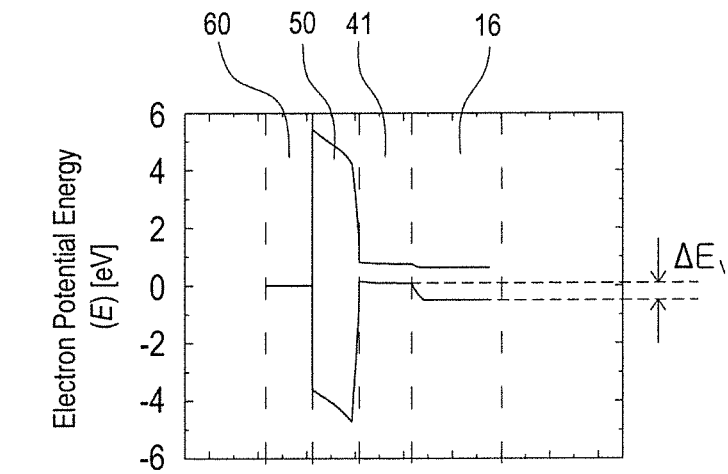
FIG. 13(a)
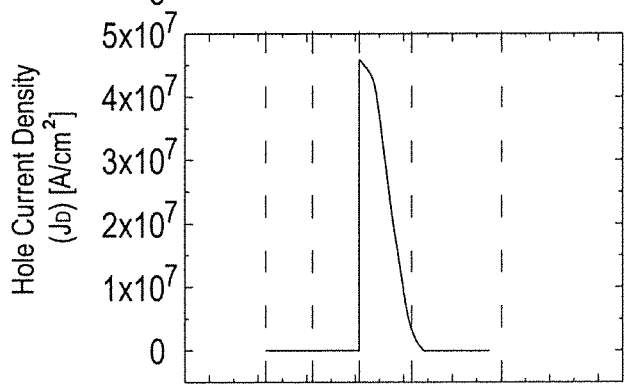
FIG. 13(b)
FIG. 14
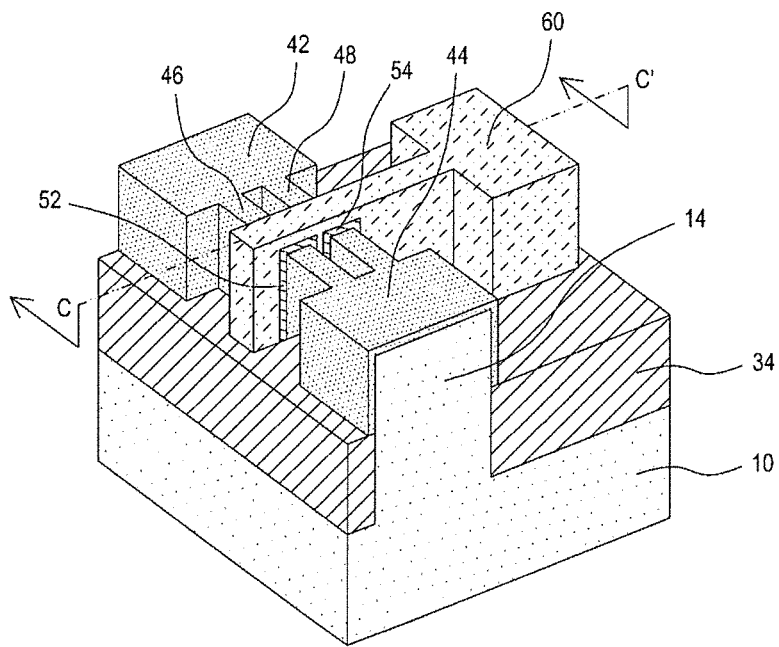

SIGE P-CHANNEL TRI-GATE TRANSISTOR BASED ON BULK SILICON AND FABRICATION METHOD THEREOF

CROSS-REFERENCE TO RELATED APPLICATION

This application is a divisional of U.S. patent application Ser. No. 15/372,695, filed on Dec. 8, 2016, which claims priority to Korean Patent Application No. 10-2016-0102082, filed on Aug. 11, 2016, under 35 U.S.C. 119, the entire contents of which are hereby incorporated by reference.

BACKGROUND OF INVENTION

1. Field of the Invention

The present invention relates to a semiconductor transistor, and more particularly to a SiGe p-channel tri-gate transistor based on a bulk silicon and fabrication method thereof.

2. Description of the Related Art

CMOS used as the various digital integrated circuits is fabricated by a complementary combination of n-channel and p-channel MOSFETs. The n-channel MOSFET has been widely studied, but the p-channel MOSFET has not.

For an example, an n-channel FinFET structure having a silicon channel with a fin shape protruded from a silicon substrate has been already developed and commercialized, but a p-channel MOSFET improved in performance has not.

Therefore, there has been a problem that it is difficult to produce CMOS together with the n-channel and p-channel MOSFETs having the same silicon fin body structure and the same level of a current operating capacity on one bulk silicon substrate by the same process.

Korean Patent No. 10-0845175 discloses a transistor with a tri-gate that comprises a fin shaped semiconductor body formed of a silicon-germanium alloy on a bulk silicon substrate, a semiconductor capping layer formed of a single crystalline-silicon film to surround the silicon-germanium body, and a gate formed to surround the silicon capping layer.

The prior patent discloses a technique for enhancing carrier mobility by getting tensile strain in the silicon capping layer formed on the fin-shaped silicon-germanium body. However, as mentioned in the prior patent, the tensile strain of the silicon capping layer is merely able to be expected to enhance the electron mobility, but not expected to improve the hole-mobility for a p-channel MOSFET. Thus, there has been a problem that it is difficult to embody a p-channel MOSFET together with an n-channel MOSFET using the above structure.

SUMMARY OF THE INVENTION

The present invention is contrived to overcome the mentioned problems. And the objective of the present invention is to provide a SiGe p-channel tri-gate transistor based on a bulk silicon and fabrication method thereof to be fabricated together with an n-channel transistor by the same CMOS process on one bulk silicon substrate, to perform a body biasing (body contact) through an integral structure of the same silicon fin-body and to drive a high-speed and low-power operation by increasing the hole mobility.

To achieve the objective, a transistor according to the present invention comprises: a silicon fin integrally formed on and protruded from a bulk silicon substrate, the silicon fin providing a body contact to the bulk silicon substrate; an isolation insulating film filled from the bulk silicon substrate to a predetermined height of the silicon fin; an active layer having a predetermined thickness formed of $Si_{1-x}Ge_x$ ($0.2 \leq x < 1$) on both opposite sidewalls and a top surface of the silicon fin on the isolation insulating film; a gate insulating film formed to surround three sidewalls of the active layer; and a tri-gate formed on the isolation insulating film to surround the gate insulating film, wherein a hole well is formed in the active layer between the gate insulating film and the silicon fin by a valence band offset electric potential against the silicon fin and is controlled by the tri-gate.

A germanium Ge fraction x of the active layer may be $0.5 \leq x < 0.9$ and the gate insulating film may comprise a silicon oxide film.

The gate insulating film may further comprise a high-κ film having permittivity higher than that of the silicon oxide film on the silicon oxide film.

The gate insulating film may be a high-κ film having permittivity higher than that of a silicon oxide film without an inserting layer of the silicon oxide film.

The silicon fin may comprise sidewalls that are protruded from the isolation insulating film having a height larger than a width of a top surface and at both ends is integrally formed with source/drain supporters that are protruded from and surrounded by the isolation insulating film having a height of the sidewalls and a width wider than the width of the top surface, wherein the active layer may further comprise source/drain contacts formed on the source/drain supporters with a thickness equal to that on the silicon fin, and wherein the tri-gate may have a width smaller than a height of a surrounding region of the silicon fin and is integrally formed with a gate contact having a width wider than that of the surrounding region.

A plurality of silicon fins having a structure equal to that of the silicon fin may be arranged in a row with a predetermined interval between the source and drain supporters. The active layer may be further formed with the same thickness on the plurality of silicon fins that protrude over the isolation insulating film. The gate insulating film may be further formed to surround three sidewalls of each of the active layers formed on the plurality of silicon fins, respectively. The tri-gate may be formed on the gate insulating films to surround three sidewalls of each of the active layers.

The thickness of the active layer may be 1 to 5 nm. A channel region surrounded by the tri-gate in the active layer may be doped with no impurity or n-type impurity having concentration of less than $10^{18}/cm^3$ and the other regions may be doped with p-type impurity having concentration of $10^{16}$ to $10^{20}/cm^3$. The silicon fin and the source/drain supporters may be doped with no impurity or n-type impurity to provide a body contact to the channel region.

The silicon substrate and the source/drain supporters may be a part of n-type substrate from the beginning and be formed after forming n-type semiconductor well on a p-type substrate.

A method for fabricating a p-channel tri-gate transistor according to the present invention comprises a first step of depositing an etching stopper thin film on a bulk silicon substrate for a planarization process; a second step of forming an etching mask on the etching stopper thin film and etching the etching stopper thin film and the bulk silicon substrate for forming an etching stopper pattern, source/drain supporters and a silicon fin; a third step of depositing an isolation insulating film material on the bulk silicon substrate and polishing by a CMP process until the etching stopper pattern is exposed; a fourth step of further etching the isolation insulating film material to a predetermined depth and removing the etching stopper pattern for protruding the source/drain supporters and the silicon fin from the isolation insulating film to a predetermined height; a fifth step of forming a silicon-germanium active layer having a predetermined thickness on the exposed source/drain supporters and the exposed silicon fin; a sixth step of forming a gate insulating film on the active layer; and a seventh step of depositing a gate material on the gate insulating film and forming a tri-gate to surround three sidewalls of the silicon fin by patterning and etching.

The etching mask of the second step may be formed by a sidewall spacer patterning process or EUVL (extreme ultraviolet lithography) for forming the silicon fin with a width smaller than that of the source/drain supporter. The active layer of the fifth step may be directly grown as a silicon-germanium layer having a germanium content on the exposed surfaces of the source/drain supporters and the silicon fin.

The gate insulating film of the sixth step may be a silicon oxide film generated from a surface of the active layer and the active layer may have increased germanium content toward the source/drain supporters and the silicon fin in a germanium condensation process of the active layer by a thermal oxidation process The gate insulating film may further form a high-κ film having permittivity higher than that of the silicon oxide film on the silicon oxide film after forming the silicon oxide film by the thermal oxidation process.

The thickness of the active layer may be 1 to 5 nm. The gate insulating film of the sixth step may be a high-κ film having permittivity higher than that of a silicon oxide film and formed by a heat treatment based on a plasma process or together a predetermined gas after treating a surface of the active layer. Another embodiment, the sixth step may further proceed a heat treatment based on a plasma process or together a predetermined gas, after the gate insulating film is formed with a high-κ film having permittivity higher than that of a silicon oxide film, to enhance an interface property between the active layer and the high-κ film The silicon substrate may be an intrinsic substrate doped with no impurity or an n-type substrate doped with n-type impurity. After the seventh step, it may further comprise steps of removing a gate insulating film by the tri-gate as an etching mask and processing an ion implantation of a p-type impurity.

The second step may form a plurality of etching masks in a row with a predetermined interval by a fineness pattern and form a plurality of silicon fins side by side between the source and the drain supporters by etching the bulk silicon substrate through the plurality of etching masks.

The present invention provides a silicon fin that protrudes from a bulk silicon substrate, a thin silicon-germanium active layer that is formed on three sidewalls of the silicon fin, and a hole well that is formed in the active layer between the gate insulating film and the silicon fin by a valence band offset electric potential against the silicon fin and that is controlled by the tri-gate for moving holes collected in the hole well along the active layer with a high hole-mobility at a turn-on state. Thus, it is possible to have the effects of not only an ultra-high speed, low power operation, but also a body biasing through an integral structure of the silicon fin-body. Especially, the present invention can be fabricated together with an n-channel FinFET transistor in one substrate by the same CMOS process.

BRIEF DESCRIPTION OF THE DRAWINGS

FIG. 13 is showing an energy-band diagram (FIG. 13a) and a hole-current density diagram (FIG. 13b) in a cross-sectional view taken along line BB' of FIG. 12 when the transistor of FIG. 12 is turned on by applying a negative voltage to the gate.

FIG. 14 is a perspective view showing a transistor structure fabricated by a fabrication method according to another embodiment of the present invention.

In these drawings, the following reference numbers are used throughout: reference number 10 indicates a bulk silicon substrate, 12 a source supporter, 14 a drain supporter, 16 and 18 a silicon fin, 20 an etching stopper thin film, 22 an etching stopper pattern, 34 an isolation insulating film, 40 and 46 an active layer, 41 and 45 an active layer sidewall, 42 a source contact, 43 an active layer top surface, 44 a drain contact, 50, 52 and 53 a gate insulating film and 60 a tri-gate.

DETAILED DESCRIPTION

Detailed descriptions of preferred embodiments of the present invention are provided below with accompanying drawings.

Figure 11:
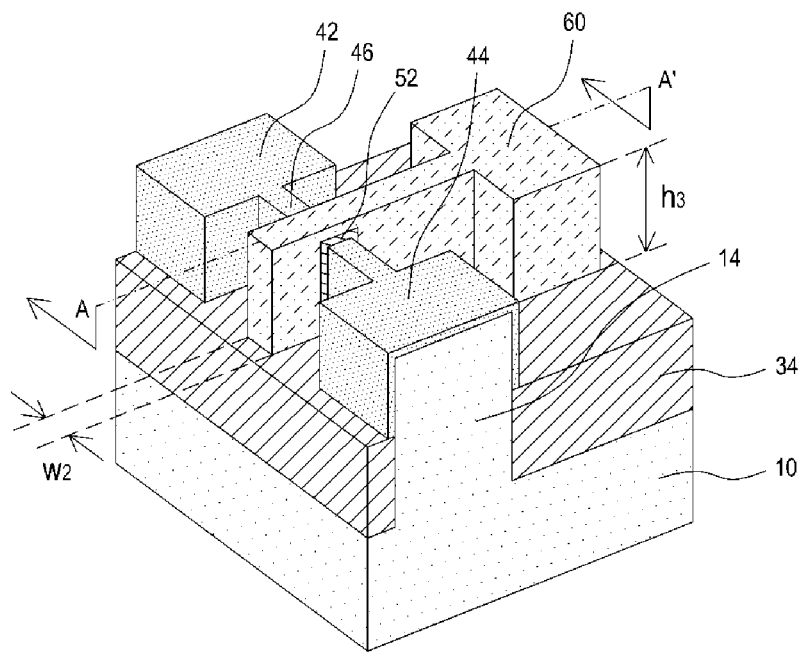
Figure 12:
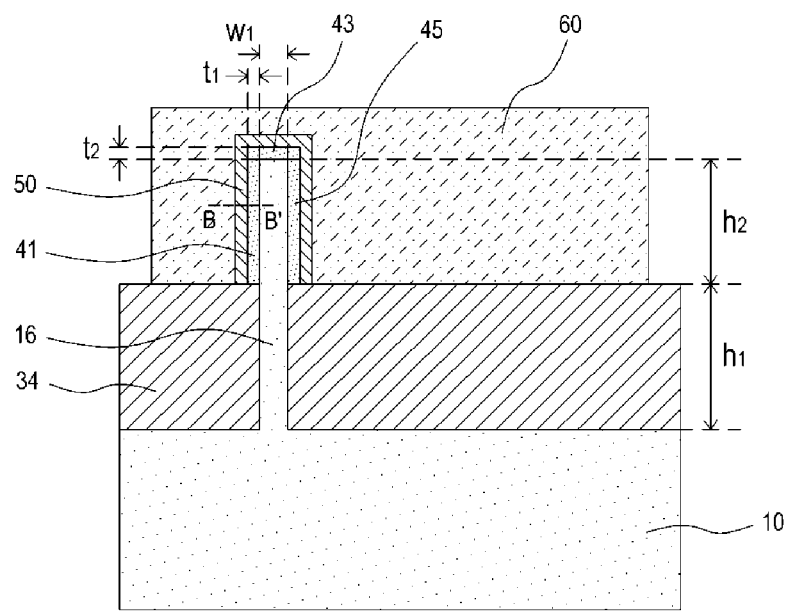
FIG. 12 is a cross-sectional view taken along line AA' of FIG. 11.

A transistor according to an embodiment of the present invention comprises, as shown in FIGS. 11 and 12, a silicon fin 16 integrally formed on and protruded from a bulk silicon substrate 10, the silicon fin 16 providing a body contact to the bulk silicon substrate 10; an isolation insulating film 34 filled from the bulk silicon substrate 10 to a predetermined height (h1) of the silicon fin 16; an active layer 40 or 46 having a predetermined thickness (t1, t2) formed of $Si_{1-x}$ (0.2≤x<1) on both opposite sidewalls and a top surface of the silicon fin 16 and on the isolation insulating film 34; a gate insulating film 50 formed to surround three sidewalls 41, 43 and 45 of the active layer 40; and a tri-gate 60 formed on the isolation insulating film 34 to surround the gate insulating film 50, wherein a hole well is formed in the active layer 40(41) between the gate insulating film 50 and and the silicon fin 16 by a valence band offset electric potential (/\Ev) against the silicon fin 16 as shown in FIG. 13 and is controlled by the tri-gate 60.

FIG. 13a is an energy-band diagram in a cross-sectional view taken along line BB' of FIG. 12 when the transistor according to an embodiment of FIG. 12 is turned on by applying a negative voltage to the tri-gate 60 and FIG. 13b is showing a current density of holes that flow the active layer 40 or 41 at the turn-on state.

The active layer 40 is preferred to be formed by $Si_{1-x}Ge_x$ (0.2≤x<1). In this case, more preferably, the germanium Ge fraction x is 0.5≤x<0.9.

Figure 17:
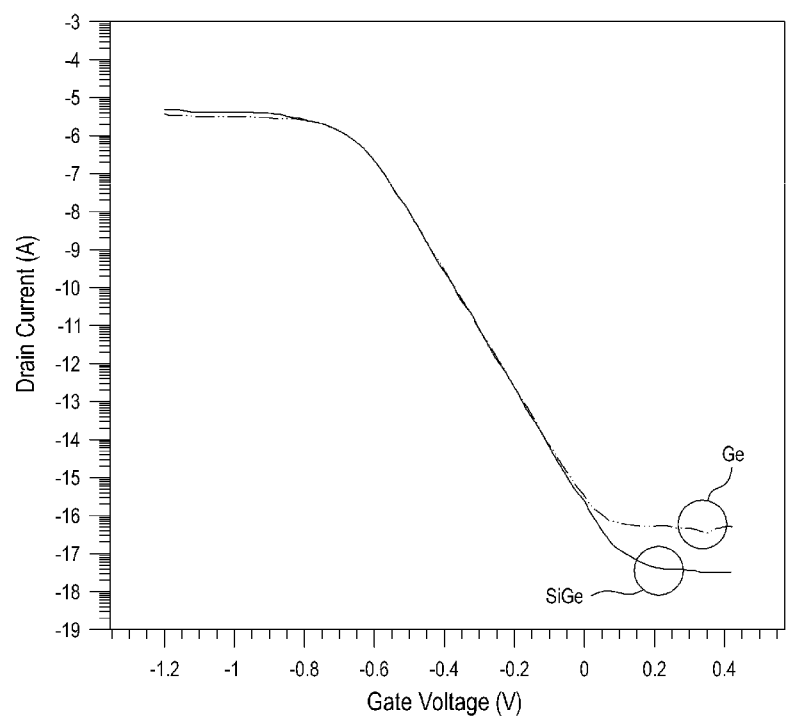
FIG. 17 is an electrical characteristic diagram showing a comparison between leakage currents of switching operations at a turn-off state when the fraction x of the $Si_{1-x}Ge_x$ active layer is x=0.9($Si_{0.1}Ge_{0.9}$) or 1(Ge) in the structure of FIG. 11.

It is preferred that the germanium Ge fraction x of the active layer 40 is closer to 1 because the valence band offset electric potential (Ev) against the silicon fin 16 and the hole-mobility can be raised. However, if the fraction x is above 0.9 to be mostly germanium Ge, there is a problem that a leakage current of switching operation at a turn-off state can be relatively large as shown in FIG. 17.

Figure 16:
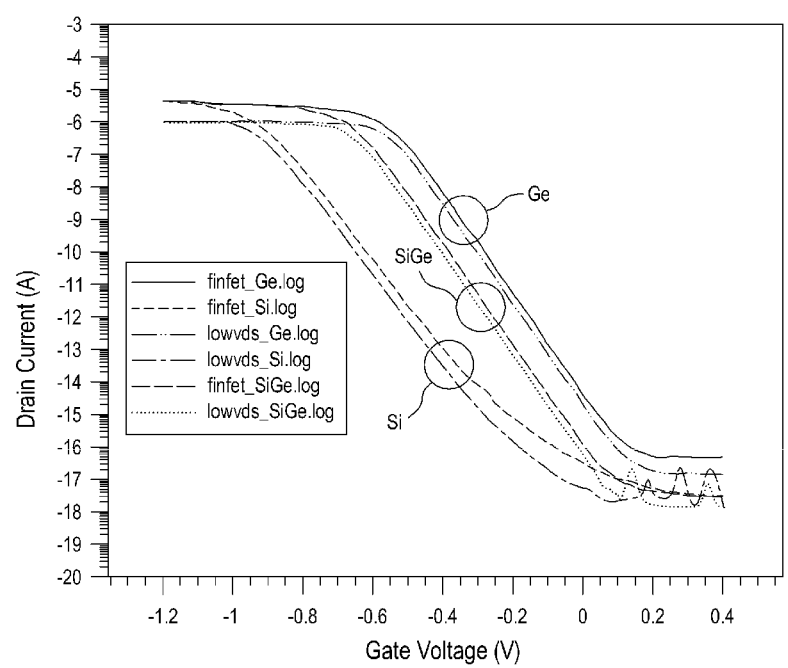
FIG. 16 is an electrical characteristic diagram showing a comparison between switching operations when the fraction x of the $Si_{1-x}Ge_x$ active layer is x=0(Si), 0.5($Si_{0.5}Ge_{0.5}$) or 1(Ge) in the structure of FIG. 11.

And when the germanium Ge fraction x is less than 0.2, there are some problems that because the valence band offset electric potential (ΔEv) against the silicon fin 16 can not be increased, it is difficult to capture and store enough amount of holes and that because the hole-mobility can be reduced to be subthreshold swing (SS) smaller than that of $Si_{0.5}Ge_{0.5}$ as known from FIG. 16, it is difficult to gain an ideal switching operation characteristic.

The gate insulating film 50 can be a silicon oxide film ($SiO_2$). According to embodiments, the gate insulating film 50 can further comprise a high-κ film having permittivity higher than that of the silicon oxide film on the silicon oxide film. The gate insulating film 50 can be also just a high-κ film having permittivity higher than that of the silicon oxide film without the silicon oxide film. Thus, it is possible to collect more holes in the hole well than the other cases without the hole well at the same applied voltage and to operate with a low voltage by an increasing gate controllability in the channel.

The silicon fin 16 can have various sizes, but preferably, comprise sidewalls that are protruded from the isolation insulating film 34 having a height (h2) larger than a width (w1) of a top surface. In this case, it is possible to preferably increase a current density without an area expansion by increasing a width (w1) of a channel formed under a tri-gate 60 through the large area of both sidewalls 41 and 45 of an active layer 46.

Figure 6:
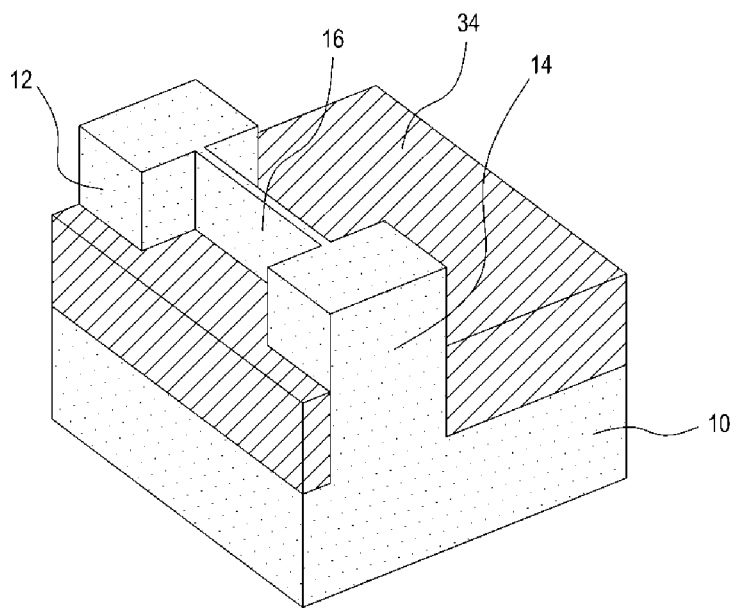

And, as shown in FIGS. 6 and 11, preferably, at both ends, the silicon fin 16 can be integrally formed together with source/drain supporters 12 and 14 protruded from and surrounded by the isolation insulating film 34 having a height equal to the height (h2) of the sidewalls of the silicon fin 16 and a width wider than the width (w1) of the top surface of the silicon fin 16 by etching the bulk silicon substrate 10.

Figure 7:
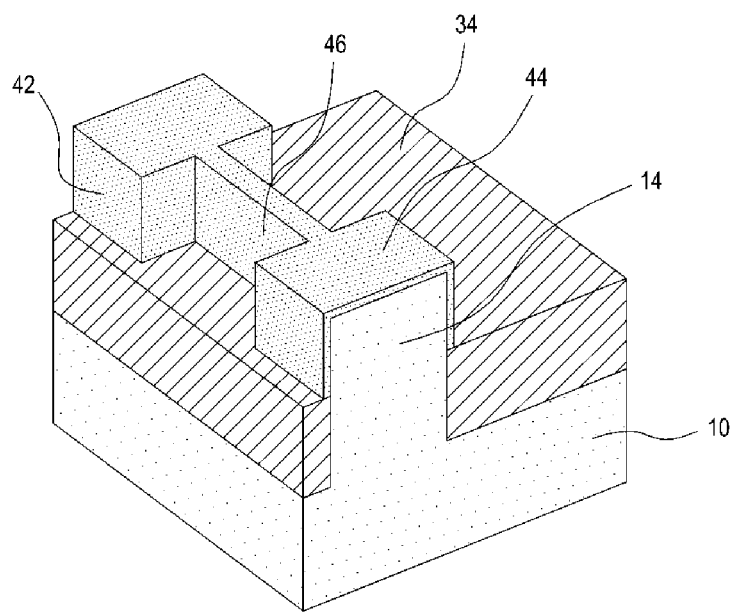

In this case, the active layer 40, as shown in FIGS. 7 and 11, can further comprise source/drain contacts 42 and 44 formed on the source/drain supporters 12 and 14 protruded from the isolation insulating film 34 with a thickness equal to that on the silicon fin 16.

The tri-gate 60, as shown in FIG. 11, can have a width (w2) smaller than a height (h3) of a surrounding region of the silicon fin 16 and can be integrally formed with a gate contact 60 having a width wider than the width (w2) of the surrounding region.

Figure 15:
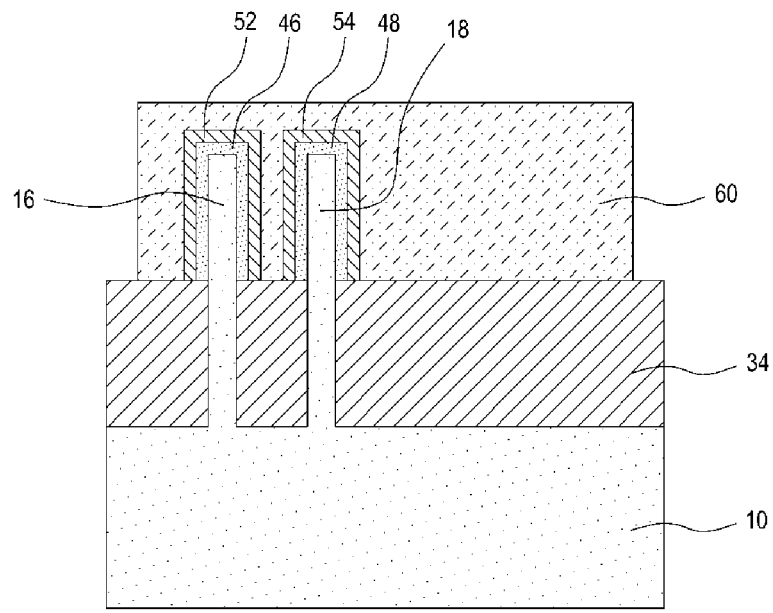
FIG. 15 is a cross-sectional view taken along line CC' of FIG. 14.

As another embodiment, as shown in FIGS. 14 and 15, a plurality of silicon fins 16 and 18 having a structure which is equal to that of the above mentioned silicon fin 16 can be arranged in a row with a predetermined interval as a shape of fingers between the source supporter 12 and the drain supporter 14 of the above mentioned embodiment. An active layer can be further formed with the same thickness on a plurality of silicon fins 16 and 18 that protrude over an isolation insulating film 34.

In this case, gate insulating films 52 and 54 can be formed to surround three sidewalls of each of the active layers 46 and 48 that are formed on a plurality of silicon fins 16 and 18, respectively. And the above mentioned tri-gate 60 can be formed as one body on the gate insulating films 52 and 54 to commonly surround three sidewalls of each of the active layers 46 and 48 that are formed on the plurality of silicon fins 16 and 18, respectively.

Thus, because a plurality of active layers 46 and 48 are arranged in a row between the source/drain contacts 42 and 44, it takes an advantage that an operating current can be raised to be able to drive a low power operation.

In each embodiment mentioned above, the source/drain contacts 42 and 44 can be the same conduction type as the active layer 46 surrounding the silicon fin 16 to form a junctionless transistor. A channel region surrounded by the tri-gate 60 in the active layer 46 can be also doped with no impurity or n-type impurity to have concentration of less than $10^{18}/cm^3$. And the active layer 46 except the channel region and the source/drain contacts 42 and 44 can be doped with p-type impurity to have concentration of $10^{16}$ to $10^{20}/cm^3$. Thus, it is possible to form a channel by enough accumulated or inversed holes in the mentioned hole well.

In the latter case, preferably, the substrate 10, the silicon fin 16 and the source/drain supporters 12 and 14 can be doped with no impurity or n-type impurity for having the same conduction type as the channel region in order that it is possible to provide a body contact to the channel region.

In each embodiment described above, the thickness of the active layer 40 or 46 can be preferably 1 to 5 nm. If it is less than 1 nm, it is profitable to increase the controllability of the tri-gate 60, but there is a problem that the amount of current itself can be decreased. However, if it is more than 5 nm, there are some problems that the active layer 46 can be uselessly thicker and that it can lead to reduce the possibility of device reduction and increase the process time and cost.

According to some related simulation results, when gate insulating film 52 is a silicon oxide film, the concentration of holes can be maximized at about 1 nm distance from a surface of $Si_{1-x}Ge_x$ active layer 40 or 46. Thus, more preferably, the thickness of the active layer 40 or 46 is 1 to 2 nm.

Descriptions of embodiments related to methods for fabricating the mentioned transistors are provided below with accompanying FIGS. 1 to 11.

Figure 1:
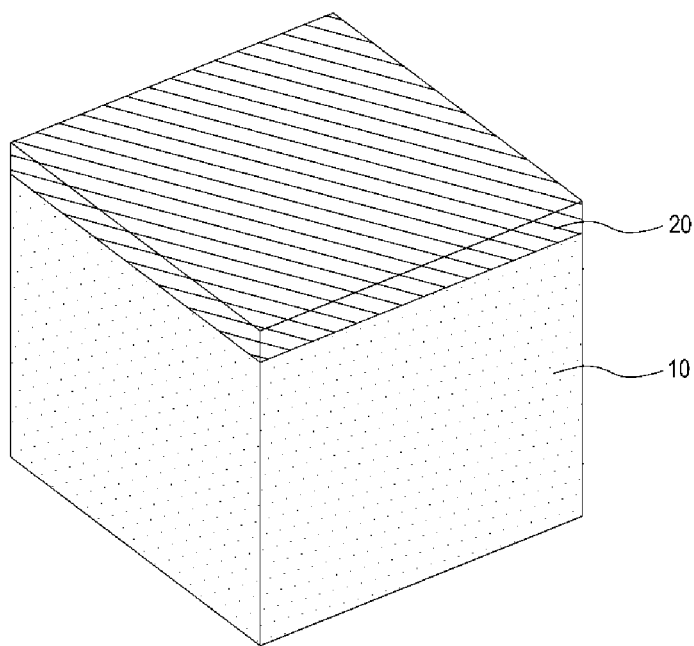
FIGS. 1 to 11 are a process perspective view showing a fabrication method of a transistor according to an embodiment of the present invention.
Figure 2:
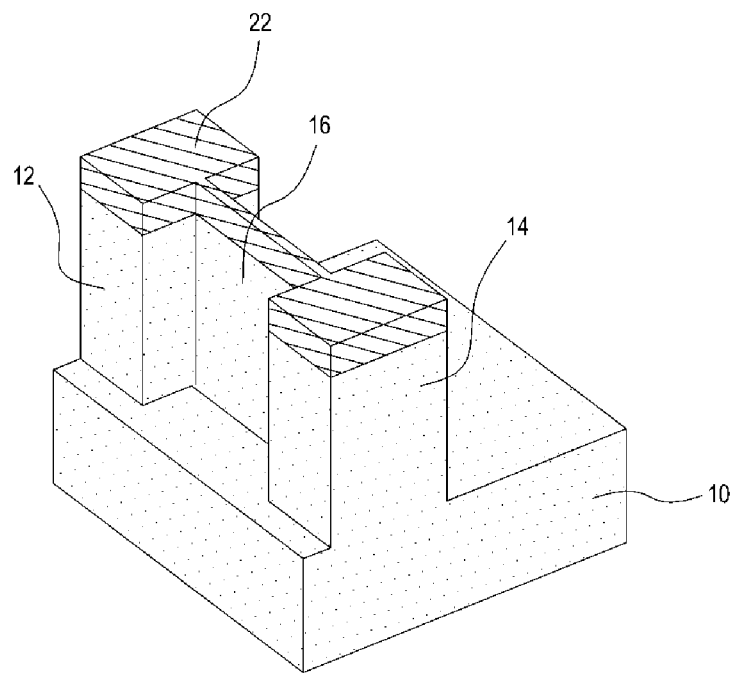

First, as shown in FIG. 1, an etching stopper thin film 20 is deposited on a prepared bulk silicon substrate 10 for a planarization process (a first step). Here, the bulk silicon substrate 10 can be an intrinsic substrate doped with no impurity, but preferably, it is an n-type substrate doped weakly with n-type impurity to have concentration of less than $10^{18}/cm^3$.

Next, an etching mask (not shown) is formed on the etching stopper thin film 20 and the etching stopper thin film 20 and the silicon substrate 10 are etched for forming an etching stopper pattern 22, source/drain supporters and a silicon fin 16 (a second step).

Here, the etching mask can be formed by a sidewall spacer patterning process or EUVL (extreme ultraviolet lithography) for forming the silicon fin 16 with a width smaller than that of the source/drain supporters.

And, as shown in FIGS. 14 and 15, for fabricating a transistor having a plurality of silicon fins 16 and 18 between the source supporter 12 and the drain supporter 14, the plurality of etching masks can be formed to arrange in a row with a predetermined interval by a fineness pattern and then the silicon substrate 10 can be etched to form a plurality of silicon fins 16 and 18.

Figure 3:
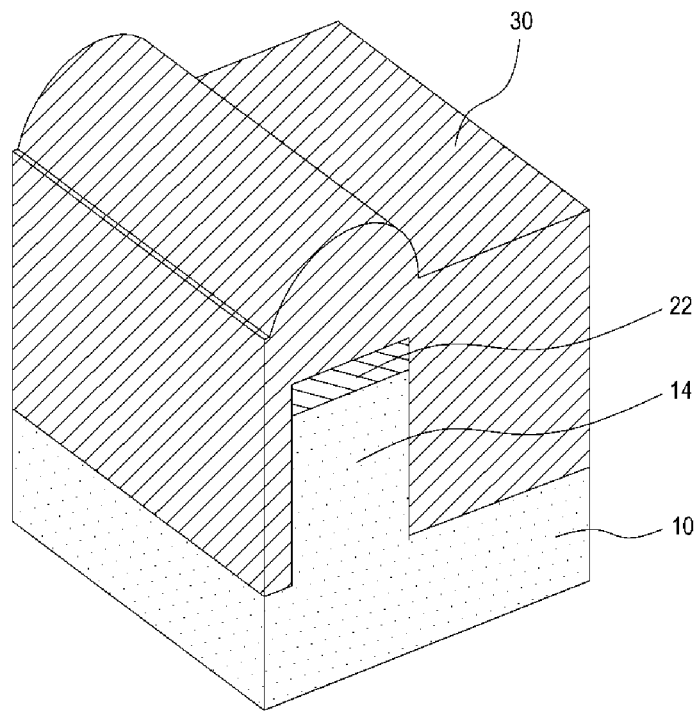
Figure 4:
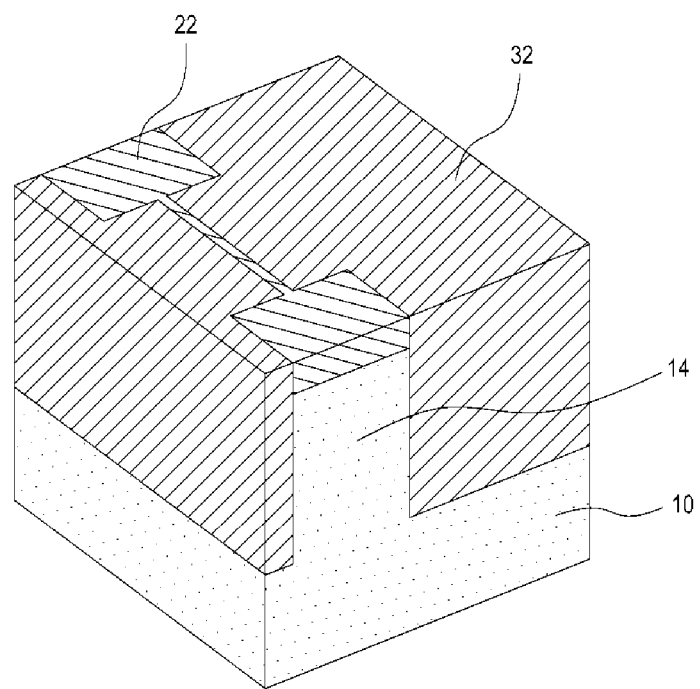

Next, as shown in FIG. 3, an isolation insulating film material 30 is deposited on the silicon substrate 10 and, as shown in FIG. 4, planarized by a CMP process until the etching stopper pattern 22 is exposed (a third step).

Figure 5:
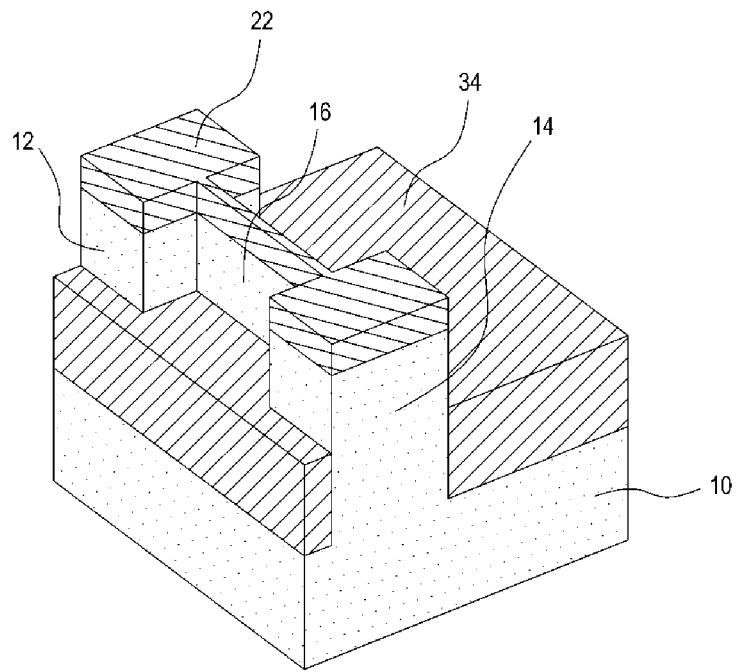

Next, as shown in FIG. 5, the planarized isolation insulating film material 32 is further etched to a predetermined depth for forming an isolating insulating film 34. And then, by removing the etching stopper pattern 22, as shown in FIG. 6, source/drain supporters 12 and 14 and a silicon fin 16 are protruded from the isolation insulating film 34 to a predetermined height (h2) (a fourth step).

Next, as shown in FIG. 7, through a CVD, epitaxial process and the like, a silicon-germanium active layers 40, 42, 44 and 46 having a predetermined thickness is formed on the exposed source/drain supporters 12 and 14 and silicon fin 16 (a fifth step).

Here, preferably, the silicon-germanium active layer can be directly grown with $Si_{1-x}Ge_x$ (0.2≤x<1) to have a thickness of 1 to 5 nm from the exposed source/drain supporters 12 and 14 and silicon fin 16.

Figure 8:
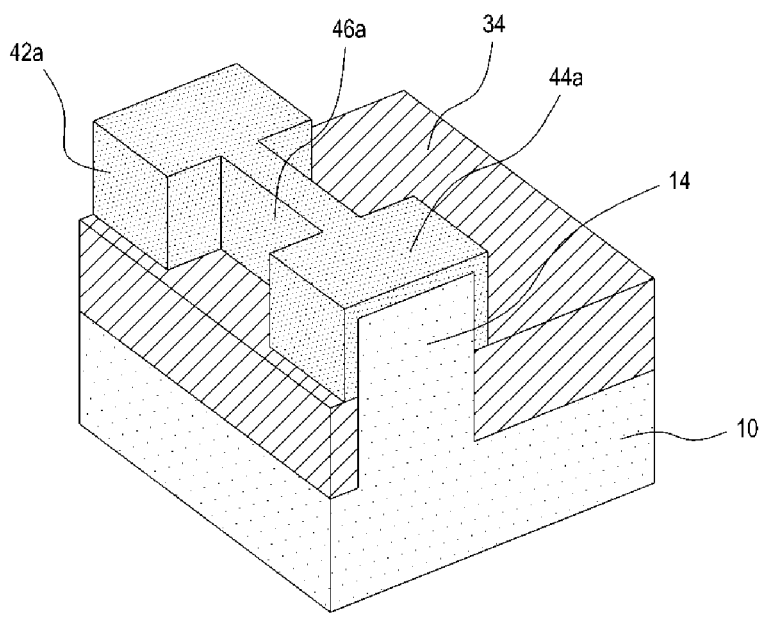

And a thickness (t1) of each of sidewalls and a thickness (t2) of a top surface of the silicon-germanium active layers 40, 42, 44 and 46 can be different from each other according to processes, but when it is grown by an epitaxial growth, it is possible to get an equal thickness. And as shown in FIG. 8, it is preferable to select a fabrication method that forms a thickness more than two times greater than that of the embodiment of FIG. 7, reduces the thickness by a germanium condensation process and is close a germanium Ge fraction x of $Si_{1-x}Ge_x$ to 1.

Figure 9:
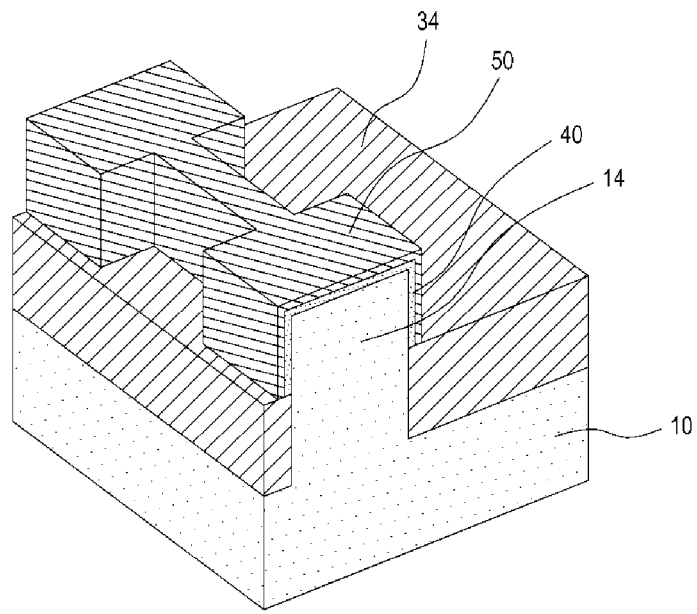

At this time, a germanium condensation process can be performed by a thermal oxidation process. In this case, as shown in FIG. 9, a silicon oxide film is formed automatically as a gate insulating film 50 from the surface of an active layer 40. And the active layer 40 used to drive a device operation can have an increased germanium content close to 100% toward the source/drain supporters 12 and 14 and the silicon fin 16.

As mentioned above, a germanium condensation can be used as a fabrication process of a gate insulating film 50. If it is not used, as shown in FIG. 9, a gate insulating film 50 is additionally formed on the active layer 40 (a sixth step).

Here, the fabrication methods of the gate insulating film 50 can include a method for obtaining a thermal oxide film (a silicon oxide film) in a condensation process by a thermal oxidation mentioned above and a method for forming a high-κ film having permittivity higher than that of a silicon oxide film after surface passivation on the active layer 40 based on a plasma process. Of cause, after the silicon oxide film is formed by the condensation, a high-κ film having permittivity higher than that of a silicon oxide film can be further formed. In the process for directly forming a high-κ film on the active layer 40, the methods for a surface passivation or an interface passivation between an active layer and a gate insulating film can include a heat treatment with a gas and a treatment of plasma. It is possible to choice a suitable time to perform the surface and/or interface passivation before or after the gate insulting film formation.

Figure 10:
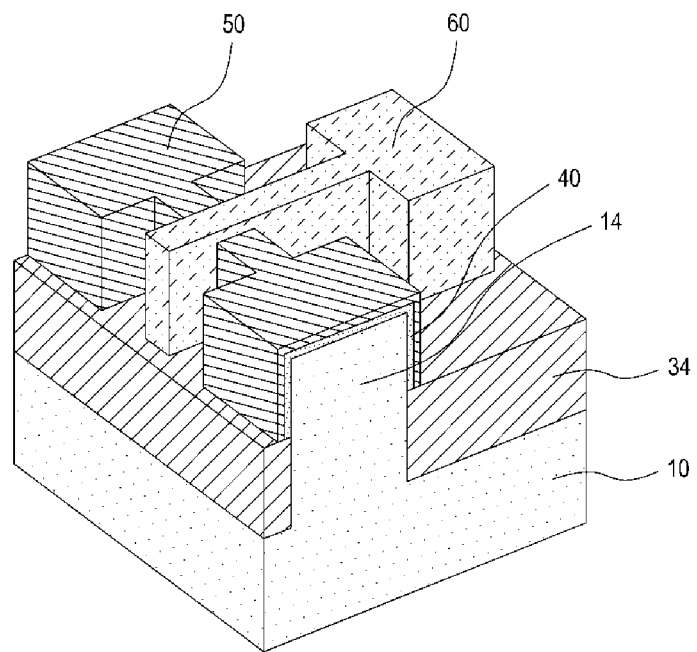

Next, a gate material is deposited on the gate insulating film 50, patterned and etched, as shown in FIG. 10, to form a tri-gate 60 surrounding three sidewalls of the silicon fin 16 (a seventh step). At this time, the gate material can be formed of a metal with a proper work function and not only silicon-based material such as poly-silicon, but also poly-silicon-germanium and poly-germanium.

When a plurality of silicon fins 16 and 18 are formed between the source supporter 12 and the drain supporter 14 as shown in FIGS. 14 and 15, a tri-gate 60 can be integrally formed as one body on an isolation insulating film 34 to interlay each of gate insulating films 52 and 54 and to transverse a plurality of active layers 46 and 48 that surround a plurality of silicon fins 16 and 18, respectively.

After the seventh step, as usual, after forming an interlayer insulating film (not shown), contact holes can be formed on source/drain contacts 42 and 44 and a gate contact to perform a wiring metal process. As shown in FIG. 11, the above step can be performed after removing the exposed gate insulating film 50 by using the tri-gate 60 as an etching mask, especially, it is preferable when the gate insulating film 50 is formed of a material such as a high-κ film that is different from the interlayer insulating film. And before and after removing the gate insulating film 50, it is possible to raise the conductivity in the tri-gate 60, the active layer 40 except the channel region and the source/drain contacts 42 and 44 by a further step of ion implantation with p-type impurity.

As above mentioned, descriptions of preferred embodiments are provided with accompanying drawings, but it is not limited thereto. The embodiments can be variously modified. Because the modifications will be performed by the person of ordinary skill in the art with reference to the embodiments described above, the descriptions thereof are omitted.

This work was supported by Business for Cooperative R&D between Industry, Academy, and Research Instituted funded by Korean Small and Medium Business Administration in 2015 (No. C0300518).

What is claimed is:

1. A method for fabricating a p-channel tri-gate transistor comprising:
    a first step of depositing an etching stopper thin film on a bulk silicon substrate for a planarization process;
    a second step of forming an etching mask on the etching stopper thin film and etching the etching stopper thin film and the bulk silicon substrate for forming an etching stopper pattern, source/drain supporters and a silicon fin;
    a third step of depositing an isolation insulating film material on the bulk silicon substrate and polishing by a CMP process until the etching stopper pattern is exposed;
    a fourth step of further etching the isolation insulating film material to a predetermined depth and removing the etching stopper pattern for protruding the source/drain supporters and the silicon fin from the isolation insulating film to a predetermined height;
    a fifth step of forming a silicon-germanium active layer having a predetermined thickness on the protruded source/drain supporters and the protruded silicon fin;
    a sixth step of forming a gate insulating film on the active layer; and
    a seventh step of depositing a gate material on the gate insulating film and forming a tri-gate to surround three sidewalls of the silicon fin by patterning and etching,
    wherein the thickness of the silicon-germanium active layer is reduced by forming the gate insulating film in the sixth step.

2. The method of claim 1,
    wherein the etching mask of the second step is formed by a sidewall spacer patterning process or EUVL (extreme ultraviolet lithography) for forming the silicon fin with a width smaller than that of the source/drain supporter, and
    wherein the active layer of the fifth step is directly grown as a silicon-germanium layer having a germanium content on the exposed surfaces of the source/drain supporters and the silicon fin.

3. The method of claim 2, wherein the gate insulating film of the sixth step is a silicon oxide film generated from a surface of the active layer, and the active layer has increased germanium content toward the source/drain supporters and the silicon fin as a result of a germanium condensation process of the active layer by a thermal oxidation process.

4. The method of claim 3, wherein the gate insulating film further comprises a high-κ film having permittivity higher than that of the silicon oxide film on the silicon oxide film after forming the silicon oxide film by the thermal oxidation process.

5. The method of claim 4, wherein the thickness of the active layer is 1 to 5 nm.

6. The method of claim 1, wherein the silicon substrate is an intrinsic substrate doped with no impurity or an n-type substrate doped with n-type impurity, and wherein, after the seventh step, the method further comprises steps of removing a gate insulating film by the tri-gate as an etching mask and processing an ion implantation with a p-type impurity.

7. The method of claim 6, wherein the second step forms a plurality of etching masks in a row with a predetermined interval by a fineness pattern and forms a plurality of silicon fins side by side between the source and the drain supporters by etching the bulk silicon substrate through the plurality of etching masks.

* * * * *